United States Patent [19]

Lammers et al.

[11] Patent Number: 5,263,193
[45] Date of Patent: Nov. 16, 1993

[54] SELFMIXING HETERODYNE SYSTEM

[75] Inventors: Uve H. W. Lammers, Chelmsford; Richard A. Marr, N. Billerica, both of Mass.

[73] Assignee: The United States of America as represented by the Secretary of the Air Force, Washington, D.C.

[21] Appl. No.: 708,542

[22] Filed: May 31, 1991

[51] Int. Cl.$^5$ .............................. H04B 1/26
[52] U.S. Cl. .................... 455/315; 455/318
[58] Field of Search ............ 455/313, 315, 318; 359/191; 432/165, 170

[56] References Cited

U.S. PATENT DOCUMENTS

| | | | |
|---|---|---|---|
| 2,934,756 | 4/1960 | Kalmus | 343/12 |
| 4,075,632 | 2/1978 | Baldwin et al. | 343/6.8 R |
| 4,709,237 | 11/1987 | Poullain et al. | 342/203 |
| 4,830,479 | 5/1989 | Lammers et al. | 350/486 |
| 4,910,523 | 3/1990 | Huguenin et al. | 342/179 |
| 5,119,035 | 6/1992 | Goy et al. | 455/226.1 |

OTHER PUBLICATIONS

Lammers, U. H. W. et al, "Narrowband Heterodyne Reception Using Unstabilized Sources", International Journal of Infrared and Millimeter Waves, vol. 11, No. 6, 1990.

*Primary Examiner*—Reinhard J. Eisenzopf
*Assistant Examiner*—Christine K. Belzer
*Attorney, Agent, or Firm*—William G. Auton; Donald J. Singer

[57] ABSTRACT

High receiver sensitivity and narrowband coherent resolution can be achieved at millimeter and submillimeter wavelengths through the process of heterodyning or intermediate frequency (IF) generation. The two frequencies, whose IF is being generated, need not be very stable in frequency or phase themselves. The requirement is only, that they fluctuate identically in frequency and phase, so that their fluctuations cancel at the IF. This can be achieved by deriving both from one and the same source. We have applied this process twice in a millimeter and submillimeter receiver of high sensitivity and resolution. At the same time the receiver is very simple, since the frequency and phase stability of the two sources involved does not affect sensitivity and resolution.

13 Claims, 3 Drawing Sheets

SELFMIXING HETERODYNE SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to millimeter wave and submillimeter wave signal receiver systems, and more specifically the invention pertains to a means for receiving and detecting characteristics of such radio frequency signals by heterodyning signals. Heterodyning signals entails mixing two frequencies together to produce another frequency which can equal the sum or the difference of the first two frequencies. The difference frequency is called intermediate frequency (IF).

Millimeter wave radio frequency signals are those signals which are greater in frequency than 30 GHz.

The task of providing a selfmixing heterodyne system to enable an IF detector to coherently detect characteristics of millimeter and submillimeter wavelength signals is alleviated, to some extent, by the systems disclosed in the following U.S. patents, the disclosures of which are incorporated herein by reference:

U.S. Pat. No. 4,830,479 issued to Lammers et al;
U.S. Pat. No. 4,910,523 issued to Huguenin et al;
U.S. Pat. No. 2,934,756 issued to Kalmus;
U.S. Pat. No. 4,709,237 ussed to Poullain et al;
U.S. Pat. No. 4,075,632 issued to Baldwin et al.

The Lammers et al reference discloses the rotating Doppler frequency shifter used in the present invention. The Huguenin reference, if used as a point-to-point or radar imaging receiver, can be improved by the present invention. It eliminates the need for separate transmit and local oscillator (LO) sources. The remainder of the references cited involve homodyne reception techniques. Homodyne reception is closely related to the present invention, in that it also uses a single source for transmit and LO signals. Since neither signal is being shifted in frequency before selfmixing, the IF is zero. Skolnik in his Radar Handbook, published by McGraw-Hill Book Company, addresses homodyne systems in Chapter 16.9, Miscellaneous CW Radars. The coherence of a homodyne IF signal is as good as that of a selfmixing heterodyne system. However, owing to the lack of a frequency offset between the transmit and LO signals, spectrum foldover may result to a modulation imposed on the transmit signal The Kalmus reference requires quadrature mixers to avoid spectrum foldover Also, an IF of zero leads to a degraded sensitivity in a homodyne receiver Poullain et al describe a method to reduce low frequency noise in a homodyne radar receiver. Spectrum foldover and sensitivity degradation can both be avoided in a selfmixing heterodyne receiver. The selfmixing heterodyne method is suitable to improve other homodyne systems such as the one described in the Baldwin et al reference.

Source power for laboratory-type experiments is often limited at millimeter and submillimeter wavelengths. This requires the use of sensitive receiving equipment, such as a narrowband heterodyne detector. High receiver sensitivity and narrowband coherent resolution can be achieved through the process of heterodyning or IF generation, where the two frequencies, whose IF is being generated, need not themselves be very stable in frequency and phase, if their fluctuations cancel at the IF. This can be achieved by deriving both from one source. We have applied this concept twice in a millimeter or submillimeter receiver of high sensitivity and resolution. At the same time the receiver is simple, since the frequency stability of the two sources involved does not affect sensitivity and resolution.

This invention pertains to a well-defined subrange out of a wide range of millimeter and submillimeter system tasks; namely the sensitive and coherent reception of signals of moderate bandwidth, where these signals are generated locally, then amplitude, frequency, or phase modulated by the device or process under test and finally received. A large number or laboratory-type experiments fall into this category. The present invention enables IF detectors to detect signal characteristics of millimeter wavelength signals in all of the applications discussed above.

SUMMARY OF THE INVENTION

The present invention includes a system for receiving and detecting characteristics of millimeter and submillimeter radio frequency signals using ordinary IF detectors and heterodyne signal processing.

As mentioned above, millimeter wave radio frequency signals have frequencies which are greater than 30 GHz. Coherent millimeter wave detector systems are complex and expensive. The present invention enables less expensive IF detectors to be able to detect the characteristics of millimeter waves by heterodyning a millimeter wave signal with a frequency-shifted millimeter wave signal to produce an IF signal, as described below.

The present invention includes a heterodyne signal processing system that enables an IF signal detector to detect the electrical characteristics of millimeter and submillimeter wavelength electrical signals which have frequencies outside the operating range of such detector. Heterodyning signals entails mixing two frequency signals together to produce a heterodyne frequency signal which can equal the sum or difference of the frequencies of the first two signals. The invention splits the millimeter wavelength signal into a first and second source signal with a power divider unit. The first source signal is frequency shifted to produce a frequency-shifted source signal. The first source signal is then used by any utilizing device of interest to produce a processed signal. The second source signal serves as an LO signal. Finally a heterodyne mixer mixes the processed, frequency-shifted source signal with the LO signal to output an IF which is detectable by an ordinary IF signal detector.

One embodiment of the invention allows an IF detector to measure the characteristics of a millimeter wave device using: a millimeter wave signal source, a directional coupler, a frequency shifter, an isolator, a circulator, and a mixer. The millimeter wave signal source produces a millimeter wavelength source signal. The directional coupler divides the millimeter wavelength source signal into two millimeter wave signals, one millimeter wave signal is sent directly to the mixer, and the other millimeter wave signal is sent through the isolator and circulator to be frequency shifted so that a frequency shifted signal is sent to the millimeter wave device being tested.

The millimeter wave device outputs a processed millimeter wavelength signal to the mixer. The mixer heterodynes the unshifted millimeter wave signal with the processed millimeter wavelength signal to output a heterodyne frequency signal that represents the difference in frequency between the two signals the mixer receives. The heterodyne frequency signal can be selected to have an IF value which is detectable by the IF detector.

In another embodiment of the invention, heterodyne signal processing is used to enable the detection of millimeter wavelength radar signals by an IF radar receiver. In this application of the invention, the radar uses: a millimeter wave signal source, an isolator, a hybrid ring, a frequency shifter, a mixer, and an IF detector.

The millimeter signal source is a signal generator capable of outputting radio frequency signals with millimeter wavelengths. The isolator conducts the source signal from the signal source to the hybrid ring while minimizing any other electrical interaction between the signal source and the hybrid ring.

The hybrid ring is an equal power divider that receives and divides the source signal into two millimeter wavelength signals. The first millimeter wavelength signal is sent to the frequency shifter and is transmitted by the radar to a target. The second millimeter wavelength signal serves as the LO signal.

When the target echo return signal is received by the radar, the hybrid ring conducts the target echo return signal and the unshifted millimeter wavelength signal to the mixer. The mixer converts the millimeter wavelength target echo return signal down to an IF signal by heterodyning the echo signal with the unshifted millimeter wavelength signal.

It is an object of the present invention to enable inexpensive IF detectors to detect the characteristics of millimeter and submillimeter wavelength signals.

It is another object of the invention to provide a heterodyne signal processing system which reduces frequencies of signals to a more easily accessible range.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a heterodyne signal processing system designed for the detection of millimeter and submillimeter wave radio frequency signals. Millimeter wave radio frequency signals often require detectors with sensitivities that are orders of magnitude above those of ordinary direct or square-law detection receivers. If the transmitter and the receiver of a millimeter system are essentially co-located, then a single source can be used for both. By Doppler shifting one component signal from the source before transmission, another unshifted component can be used as an LO signal as described below. The IF resulting from the heterodyning process translates the information carried by the transmitted millimeter wave signal to a more easily detectable frequency range.

Figure 1:
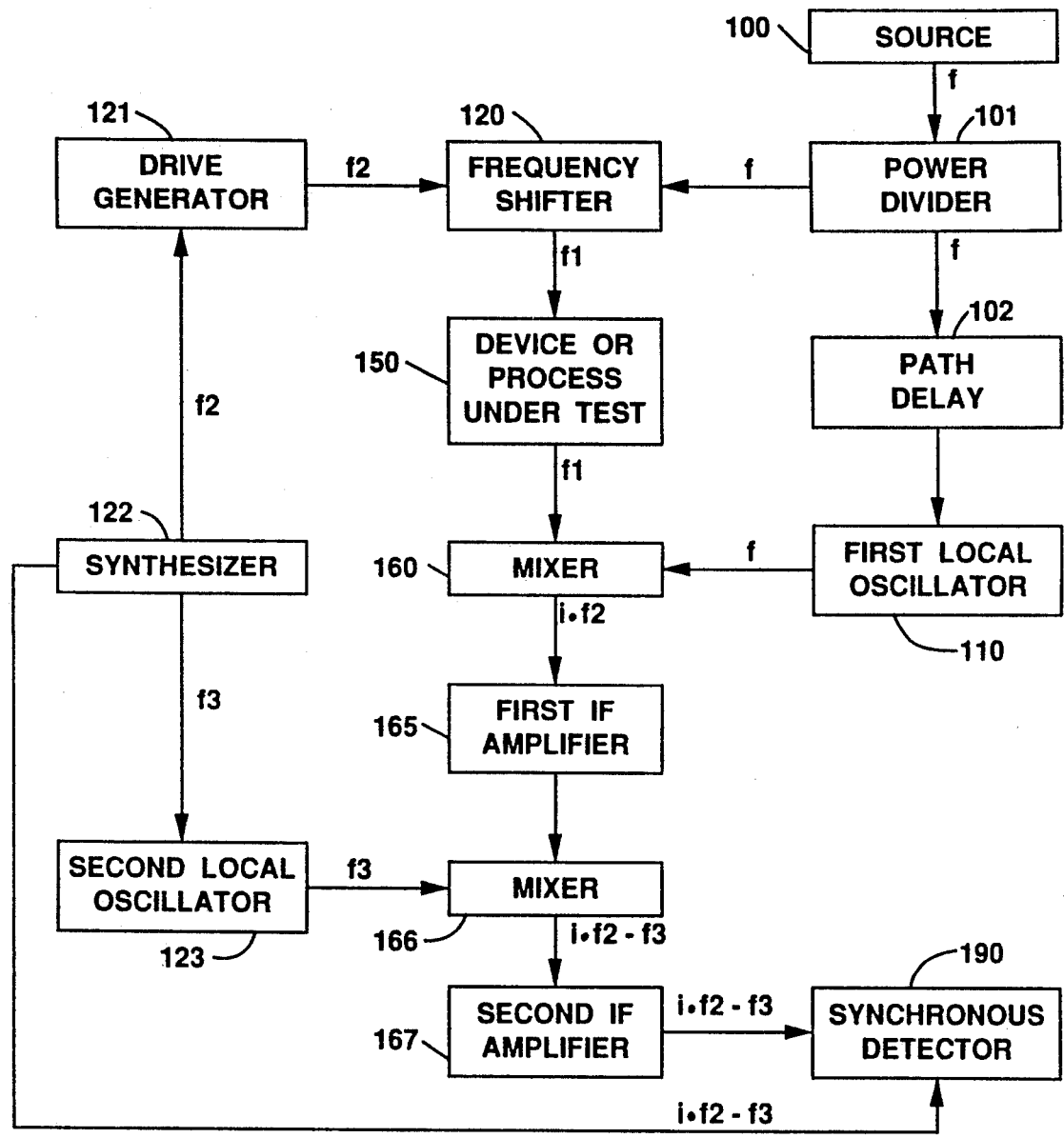
FIG. 1 is a block diagram of the operation of the present invention.

The reader's attention is now directed towards FIG. 1, which is a schematic showing the operation of the present invention. The system of FIG. 1 uses a single millimeter or submillimeter wave signal source 100 such as a klystron, Gunn diode, or laser, which is not stabilized in frequency or phase through external means. Typically, this source 100 will exhibit some frequency drift as well as frequency and phase fluctuations. We assume, that amplitude fluctuations are insignificant or can be made insignificant through the use of power levelling techniques. They do not relate directly to the subject of this invention. The available source power of frequency f is divided by power divider 101 into two components. One is used directly at the first local oscillator 110 to provided an LO signal. The other is frequency shifted in a Doppler frequency shifter 120 or single sideband modulator, such that its power is largely converted to another frequency, whose value f1 is determined by the parameters of the frequency shifter 120 and by frequency f2 of the drive generator 121. Note that the frequency shifter imposes an offset $f - f1$ on f; that is, any frequency drift and frequency or phase fluctuation of f translates to f1 as well. The frequency shifted transmit signal f1 passes through the device or process under test 150 and is heterodyned against the first LO signal f to generate the first IF, $f - f1$. To the extent that the delays of signals f and f1 are equal while travelling on their respective paths from the source to the mixer 160, frequency drift and frequency or phase fluctuations on both signals are also equal and cancel at the first IF through subtraction. This is not the case for the modulation imposed on the transmit signal by the device or process under test 150. This modulation translates directly to the first IF. In order for the undesired fluctuations of the source signal to cancel, a path delay 102 has been added to the first LO path, to compensate for path delays accrued on the transmit path (for example, if the transmit path contains twice the antenna-to-target distance in a radar system). Delay equalization can be carried to the limit, where the Doppler frequency shifter itself involves a small, but variable path delay, which must remain uncompensated.

Assume that the frequency shifter employs a repetitive process of Doppler shifting. No practical device is known to generate a Doppler shift continuously. Below we will address practical implementations of repetitive Doppler shifters, which can be used with the subject invention. Suffice it to say here, that the repetitive process must be phase coherent. After an integral number of periods of Doppler shift, the device must jump back to its starting point and repeat the process. In effect, the parameters of the frequency shifter must be chosen such that frequency f undergoes an integral number of periods of Doppler shift during one cycle of frequency shifter operation, which occurs at a rate f2. Only under such conditions does the frequency shifter produce a single frequency output f1, where $f - f1 = i \cdot f2$. Here i is an integer determined by f and the frequency shifter parameters. If f changes slightly, such as due to drift, the frequency shifter output becomes a line spectrum with IF power occurring at $(i+1) \cdot f2$, $(i+2) \cdot f2$, etc. It takes a substantial change of f to combine all frequency shifted power at one of the adjacent lines $(i+1) \cdot f2$ or $(i-1) \cdot f2$. Practically, as f drifts from its original value by an amount typical of unstabilized sources, most signal power is still converted to the first IF of $i \cdot f2$. The actual loss in IF power to other spectral lines has been investigated and is negligible. This says that the first IF, while dependent on the stability of f2, the repetition frequency of the Doppler shifting process, is independent of the drift in f. Frequency f2 is synthesized in synthesizer 122 as $f2=k \cdot f0$, where k is a constant and f0 is the synthesizer reference frequency. It can itself be unstable. If we synthesize another frequency f3 as a second LO frequency, where $f3=p \cdot f0$ (p is a constant), then the second IF becomes independent of f0 changes as well. This follows from $i \cdot f2 - f3 = i \cdot k \cdot f0 - p \cdot f0$, with $i \cdot k = p$ when converting directly to baseband or zero IF. In FIG. 1 we added a synchronous detector 190 operating at a finite second IF $i \cdot f2 - f3$. Its switching signal $i \cdot f2 - f3$ is also derived from f0, so that independence of f0 is achieved at this stage. Other detection schemes are conceivable, such as an in- phase and quadrature (I&Q) detector with subsequent fast Fourier transform analyzer to analyze the modulation spectrum introduced by the device or process under test. Within the constraints mentioned, the present invention includes a selfmixing heterodyne system, which, to a first order, is independent in its coherent bandwidth of the frequency stability of the oscillators involved. Three stages of frequency conversion have been used in FIG. 1. The minimum number of conversions needed to apply the concept described here is two. The second IF was added to convert the output to a frequency range compatible with synchronous detector operation. The sensitivity of a heterodyne receiver is inversely proportional to its coherent bandwidth. High sensitivity and spectral resolution can be achieved even with unstabilized millimeter and submillimeter wave sources.

Figure 2:
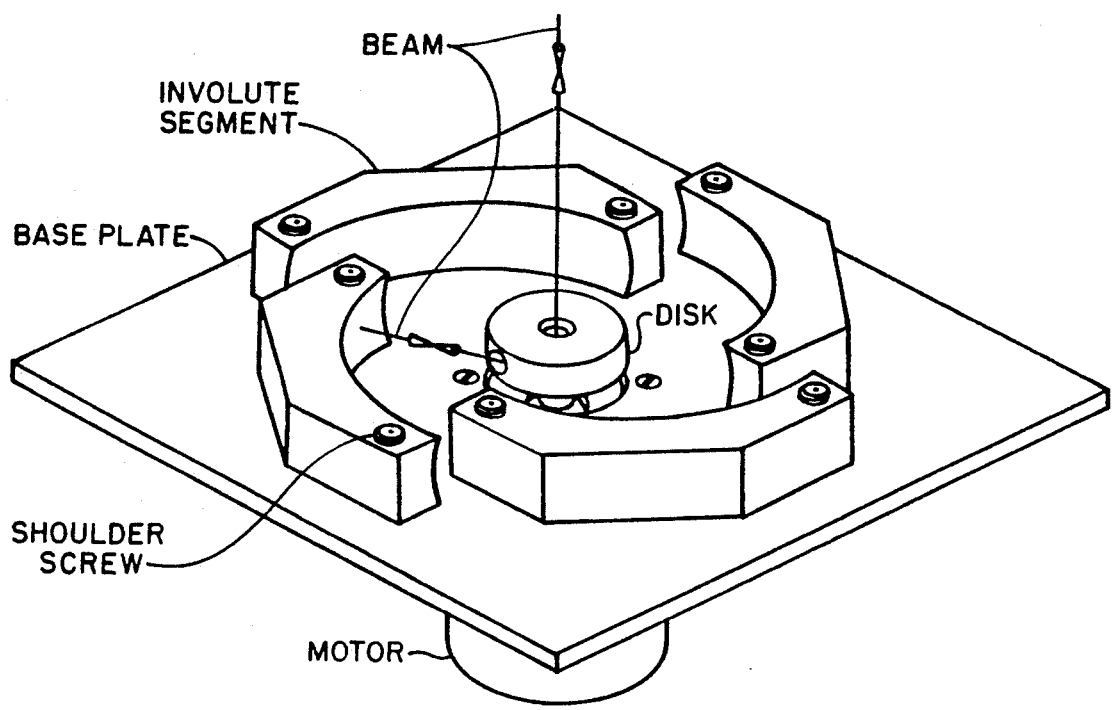
FIG. 2 is an illustration of the rotating Doppler frequency shifter of the above-cited Lammers et al reference.

One preferred embodiment of a Doppler frequency shifter, useful in a selfmixing heterodyne system, has been described by Lammers and Marr in U.S. Pat. No. 4,830,479, which is incorporated herein by reference. A schematic view of the frequency shifter in FIG. 2 illustrates its basic mode of operation. The center rotating disk with appropriate passages for the beam contains two flat mirrors to deflect the axially arriving beam of frequency f, first in radial and then in tangential direction. Exiting tangentially from the disk, the beam retroreflects from one of four stationary segments, each shaped according to the involute of a circle of radius R. This is the same radius, at which the outer tangentially reflecting mirror rotates. The stationary segments with involute contours are shaped circularly in transverse direction with a radius equal to the involute's local radius of curvature. The reflected beam exits the disk axially with frequency f1. A single frequency output requires the step, where the beam transitions from one segment to the next, to be an integer multiple of half the wavelength $\lambda=c/f$ (c is the velocity of light). Operation of the frequency shifter is therefore optimum for a raster of frequencies, each with a different integer n. Metallic reflection makes this frequency shifter highly efficient at millimeter and submillimeter wavelengths. Due to its mechanical mode of operation, only moderate values of frequency offset $f-f1$ can be achieved. The amount of offset has a direct impact on the first mixer noise temperature and hence receiver sensitivity. It also affects the frequency range, over which the modulation spectrum due to the device or process under test can be unambiguously observed. The higher the frequency offset, the better the sensitivity and free spectral range.

Since the first IF is determined as a frequency stable multiple of the frequency shifter repetition frequency f2, and since a variation in frequency shifter internal pathlength even smaller than in FIG. 2 is desirable, other kinds of frequency shifters are of interest. Slight imperfections in the phase progression of the frequency shifter output are tolerable, as mentioned earlier. They cause some output at other harmonics of f2, which can be eliminated through filtering. Power loss at the desired frequency f1 and magnitude of $f-f1$ are the most important factors in determining the usefulness of a particular design. As extreme cases we consider a reflective 180 degree phase shifter or a transmissive 360 degree phase shifter. Such devices could serve as frequency shifters as well, if providing such phase shift in repetitive linear sawtooth form. High repetition rates are possible in solid state devices not in mechanical motion. Other periodic, mechanical frequency shifters achieve higher frequency offsets through different means, such as reflection from travelling acoustic surface or bulk waves. A patent application (Ser. No. 07/529,032) for a mechanical frequency shifter similar in output, but different in principle from the one of FIG. 2 has been filed by Morris, Lammers, and Marr. This is to show that our invention is not restricted to any one frequency shifter in particular, since in achieving its objective it is tolerant to the imperfections of such devices.

Figure 3:
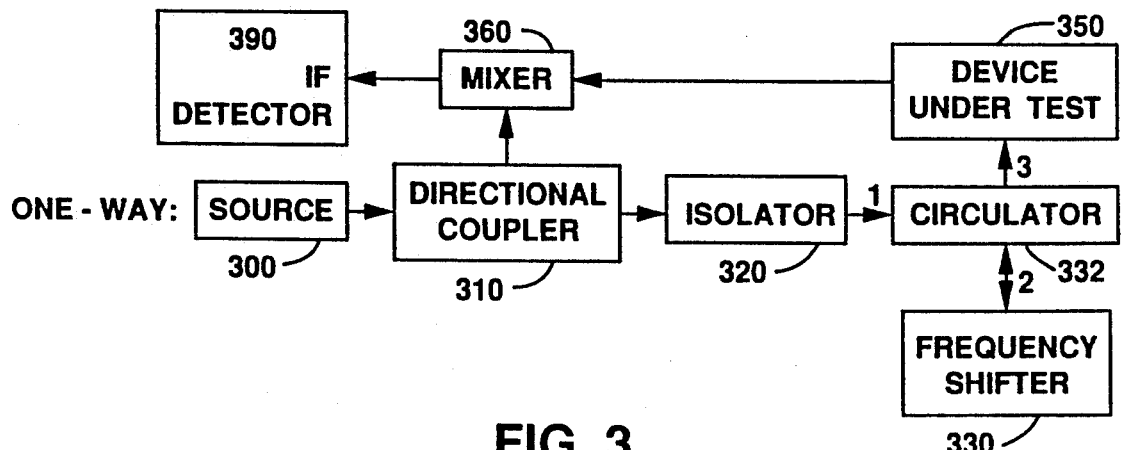
FIGS. 3-5 are block diagrams of different applications of the present invention.

FIG. 1 makes use of a transmissive frequency shifter, whereas in FIG. 2 a reflective frequency shifter is shown. Three types of systems involving the reflective frequency shifter are sketched in FIGS. 3-5. These make use of waveguide components, which are practical at least at the lower end of the millimeter wavelength range. At its high end and at submillimeter waves, they might be replaced by their quasioptical or some other low-loss equivalents. The system labeled ONE-WAY in FIG. 3 divides the signal from source 300 in a directional coupler 310. One component serves as the LO signal, the other passes through an isolator 320 and a circulator 332 to the frequency shifter 330. After frequency shifting, the output from the circulator passes through the device or process under test 350, before returning to the mixer 360, where the first IF is generated. It is generally advantageous in FIGS. 3-5 to use the frequency shifted signal for transmission and the unshifted signal for the LO. Undesired spectral lines generated by the imperfection of the frequency shifting process in addition to the desired line are equally attenuated on the transmission path. Otherwise, they would appear at the mixer in full strength. Care must be exercised, so that the total attenuation between ports 2 and 1 of the circulator, the isolator, and the directional coupler is higher than that of the device or process under test by a reasonable margin. This is necessary to prevent a part of the frequency shifter signal from returning to the mixer along the former path and affecting the measurement.

Figure 4:
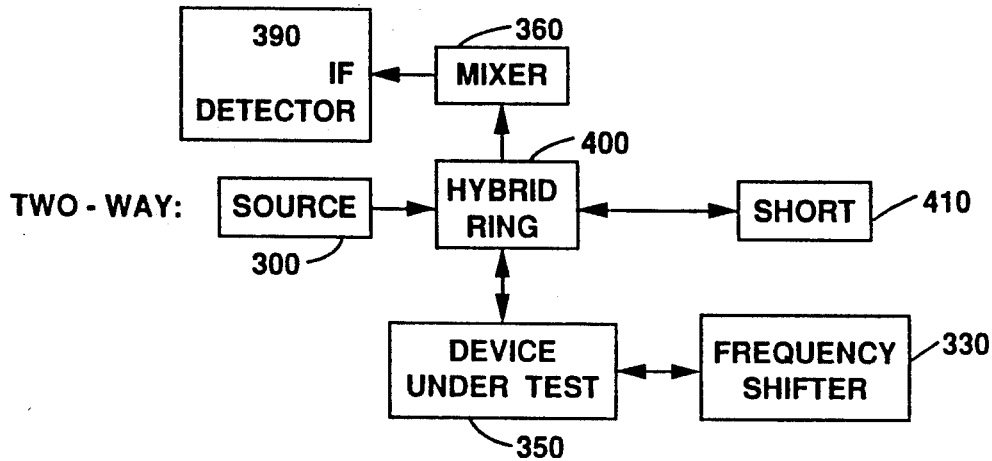

The TWO-WAY system in FIG. 4 makes use of a hybrid ring 400. The hybrid ring symbolizes a device, where the signal arriving at any port is equally divided between adjacent ports, while nothing is transmitted to the opposite port. Thus, the signal arriving from the source 300 goes to the mixer 360 (LO signal) and to the device or process under test 350. After reflection and frequency shifting from the frequency shifter 330, the signal passes through the device or process under test again and is split in half by the hybrid ring. The component toward the source is lost. The other is reflected from the short 410, divided again with one half reaching the mixer to generate the first IF. In this configuration the transmitted signal is modified twice by the device or process under test. There is no undesirable path for the frequency shifted signal to couple into the mixer.

Figure 5:
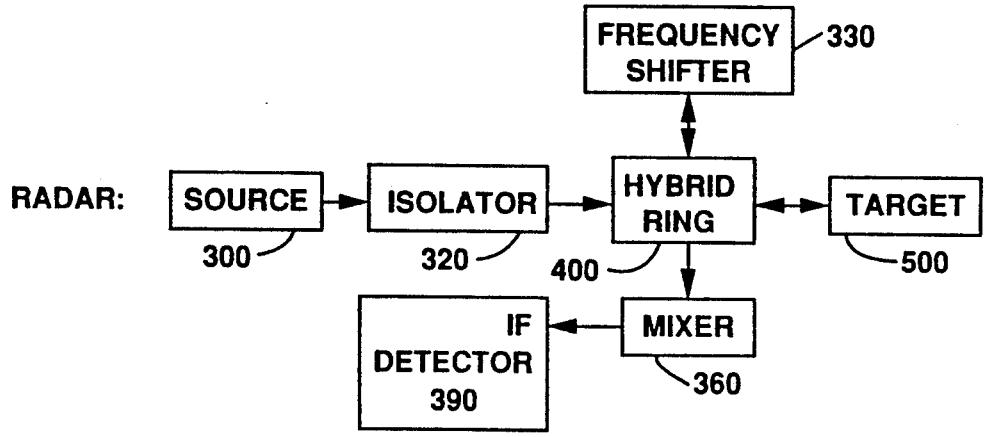

The RADAR system in FIG. 5 divides the source signal similarly with a hybrid ring. The unshifted component serves as the LO. The frequency shifted component, upon reflection, is half absorbed in the isolator, half transmitted from a single antenna to the target. The echo signal is divided again by the hybrid ring, with half of it reaching the mixer. As with the ONE-WAY scheme, care must be taken to prevent the frequency shifter output from directly reaching the mixer. Frequency shifts introduced on the transmit signal by the device or process under test will additionally permit to distinguish it frequency-wise from direct leakage.

This invention has been written as applicable toward millimeter and submillimeter systems, where it is being tested in practice. Obviously, there is no conceptual constraint to use it at shorter or longer wavelengths. Our principal improvement is the dual frequency conversion scheme as it eliminates the detrimental effects of source frequency drift and frequency or phase fluctuations through frequency shifting. That is, the generation of a first IF by heterodyning the transmit frequency f1 against the LO frequency f such that the IF frequency $i \cdot f2$ is only dependent on f2, the repetition frequency of the Doppler shifting process. Changes in f2 are then compensated for by heterodyning $i \cdot f2$ against f3 to baseband or zero IF, where f3 is generated from the same reference frequency f0 as is f2. Our secondary improvement is the minimal requirements imposed on a Doppler frequency shifter in order to achieve our primary improvement. This makes it possible to use any high speed phase shifter of reasonably linear phase progression over at least 180 deg for a frequency shifter.

This invention describes the process of how to use a Doppler frequency shifting process to substantially increase the sensitivity of simple millimeter and submillimeter receivers. By twice exploiting the stability of the difference frequency between two frequencies varying in unison, we arrive at an overall dynamic range and relative frequency resolution not previously achieved with such basic systems at these wavelengths. Although quite generally applicable, the technique outlined here requires co-located transmitters and receivers, practical in the laboratory or in a radar configuration. An experimental system was built with a Gunn oscillator and a passive tripler for a source. It was unstabilized in frequency by external means, except for a well regulated bias supply. With f1 = 140 GHz, f2 = 97.7 Hz, $i \cdot f2 = 10.9$ kHz and $i \cdot f2 - f3 = 1$ Hz, we demonstrated a coherent system resolution of better then 0.001 Hz and a sensitivity better than $-151$ dBm.

Measurements of equal coherence and sensitivity as made possible by our invention, would require a complex and costly apparatus to conventionally stabilize sources independently in frequency. Such stabilization would permit absolute frequency measurements as a side benefit. However, absolute frequency measurements are of no importance in many applications.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A heterodyne reception system that enables an intermediate frequency detector to detect signal characteristics of millimeter and submillimeter wavelength radio frequency signals, said heterodyne reception system comprising:
    a source which outputs a source signal which has a frequency greater than 30 GHz;
    a means for dividing said source signal into a first source signal and a second source signal, said dividing means being electrically connected with said source to receive said source signal therefrom, said dividing means thereby outputting said first and second source signals such that they each have an equal frequency greater than 30 GHz;
    a means for shifting the frequency of the first source signal, said frequency shifting means being electrically connected with said dividing means to receive said first source signal thereby, said frequency shifting means outputting a frequency-shifted source signal;
    a utilizing means which receives and processes said frequency-shifted source signal to output a processed signal; and
    a means for heterodyning radio frequency signals, said heterodyning means outputting an intermediate frequency signal representing a difference in frequency between said processed signal, from said utilizing means, and said second source signal, said heterodyning means thereby outputting an intermediate frequency signal to said intermediate frequency detector.

2. A heterodyne reception system, as defined in claim 1, wherein said frequency shifting means comprises a rotating Doppler frequency shifter which is electrically connected between said dividing means and said utilizing means to produce said frequency-shifted source signal thereby.

3. A heterodyne reception system, as defined in claim 1, wherein said heterodyne means comprises a mixer unit which is electrically connected with said second source signal and said utilizing means to produce said intermediate frequency signal by heterodyning the second source signal, which is unshifted, with the processed signal from the utilizing means.

4. A heterodyne reception system, as defined in claim 3, wherein said frequency shifting means comprises a rotating Doppler frequency shifter which is electrically connected between said dividing means and said utilizing means to produce said frequency-shifted source signal thereby.

5. A heterodyne reception system, as defined in claim 1, wherein said utilizing means comprises a radar transceiver system which transmits said frequency-shifted signal as a transmitted radar signal and which outputs a target echo return signal to said heterodyning means as said processed signal.

6. A heterodyne reception system, as defined in claim 5 wherein said heterodyne means comprises a mixer unit which is electrically connected with said second source signal and said utilizing means to produce said intermediate frequency signal by heterodyning the second source signal, which is unshifted, with the processed signal from the utilizing means.

7. A heterodyne reception system, as defined in claim 6, wherein said frequency shifting means comprises a rotating Doppler frequency shifter which is electrically connected between said dividing means and said utilizing means to produce said frequency-shifted source signal thereby.

8. A heterodyne reception system as defined in claim 7 wherein said frequency shifting means rotates at a rate of rotation with a repetition such that the intermediate frequency generated is an integral multiple of said rate of rotation.

9. A heterodyne reception system as defined in claim 7, wherein the reference frequency applied to said intermediate frequency detector for conversion of said intermediate frequency signal to baseband is derived from the same signal source as is the signal driving the rotating frequency shifter.

10. A heterodyne reception system, as defined in claim 1, wherein said dividing means comprises a power divider unit which is electrically connected between said source, said frequency shifting means, and said heterodyning means.

11. A heterodyne reception process that enables intermediate frequency signal detectors to detect signal characteristics of millimeter and submillimeter wavelength radio frequency signals, said heterodyne reception process comprising:

dividing millimeter and submillimeter wavelength radio frequency signals into a first source signal and a second source signal, said first and second source signal each having a frequency greater than 30 GHz;

shifting the frequency of the first source signal to produce thereby a frequency-shifted source signal, and utilizing the frequency-shifted source signal to produce thereby a processed signal, wherein said utilizing step comprises using said frequency-shifted source signal in a radar transmitter and outputting a received target echo return signal as said processed signal; and heterodyning said processed signal with said second source signal, which is unshifted, to produce thereby a heterodyne signal which has a frequency which has a value representing a difference between the frequency-shifted source signal and said second source signal, said heterodyne signal being detectable by intermediate frequency signal detectors.

12. A heterodyne reception process, as defined in claim 11, wherein said utilizing step comprises testing an electronic component by inputting said frequency-shifted source signal into it and outputting an electrical response from said electrical component as said processed signal.

13. A heterodyne reception process as defined in claim 11, wherein said shifting step is performed by processing the first source signal by a rotating Doppler frequency shifter to product thereby said frequency-shifted source signal.

* * * * *